United States Patent
Rackow et al.

(10) Patent No.: US 10,164,409 B2
(45) Date of Patent: Dec. 25, 2018

(54) SEMICONDUCTOR LIGHT-EMITTING DEVICE AND METHOD FOR MANUFACTURING THE SAME

(71) Applicant: STANLEY ELECTRIC CO., LTD., Meguro-ku, Tokyo (JP)

(72) Inventors: Philip Rackow, Yokohama (JP); Yusuke Yokobayashi, Yokohama (JP); Keijiro Takashima, Yokohama (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/439,583

(22) Filed: Feb. 22, 2017

(65) Prior Publication Data

US 2017/0244220 A1   Aug. 24, 2017

(30) Foreign Application Priority Data

Feb. 23, 2016 (JP) ................... 2016-031656

(51) Int. Cl.
| | |
|---|---|
| H01S 5/32 | (2006.01) |
| H01S 5/22 | (2006.01) |
| H01S 5/042 | (2006.01) |
| H01S 5/24 | (2006.01) |
| H01S 5/02 | (2006.01) |
| H01S 5/323 | (2006.01) |

(52) U.S. Cl.
CPC .......... *H01S 5/3202* (2013.01); *H01S 5/0202* (2013.01); *H01S 5/0425* (2013.01); *H01S 5/2202* (2013.01); *H01S 5/24* (2013.01); *H01S 5/0203* (2013.01); *H01S 5/2201* (2013.01); *H01S 5/32341* (2013.01)

(58) Field of Classification Search
CPC ........ H01S 5/3202; H01S 5/2202; H01S 5/24; H01S 5/0425
See application file for complete search history.

(56) References Cited

U.S. PATENT DOCUMENTS

| | | | |
|---|---|---|---|
| 7,924,897 B2 | 4/2011 | Ohno | |
| 2001/0013608 A1* | 8/2001 | Kobayashi | ............ H01L 29/045 257/88 |

(Continued)

FOREIGN PATENT DOCUMENTS

| | | |
|---|---|---|
| JP | 2008060478 A | 3/2008 |
| JP | 2011211244 A | 10/2011 |
| JP | 5451724 B2 | 3/2014 |

*Primary Examiner* — Yuanda Zhang
(74) *Attorney, Agent, or Firm* — Holtz, Holtz & Volek PC (57) ABSTRACT

A method for manufacturing a semiconductor light-emitting device includes: forming a plurality of guide grooves so as to be depressed from a surface of a semiconductor structure layer toward a semiconductor substrate and to align and extend along a direction perpendicular to an extending direction of a plurality of line electrodes; forming, in each of the plurality of guide grooves, a scribe groove so as to be depressed from a bottom surface of the guide groove toward the semiconductor substrate and to extend along an extending direction of the guide groove; and dividing a semiconductor wafer along the plurality of guide grooves. The guide groove and the scribe groove are formed to have end shapes in such a manner that inner walls thereof project toward each other in the extending direction of the scribe groove.

5 Claims, 10 Drawing Sheets

(56) References Cited

U.S. PATENT DOCUMENTS

| | | | |
|---|---|---|---|
| 2003/0030053 A1* | 2/2003 | Kawakami | B82Y 20/00 257/72 |
| 2007/0093041 A1* | 4/2007 | Tanaka | H01L 21/78 438/463 |
| 2009/0185594 A1* | 7/2009 | Hiroyama | B82Y 20/00 372/45.01 |
| 2009/0262771 A1* | 10/2009 | Inoue | B82Y 20/00 372/45.01 |
| 2011/0124140 A1 | 5/2011 | Ohno | |
| 2013/0148681 A1 | 6/2013 | Hamaguchi et al. | |

* cited by examiner

SEMICONDUCTOR LIGHT-EMITTING DEVICE AND METHOD FOR MANUFACTURING THE SAME

BACKGROUND OF THE INVENTION

1. Field of the Invention

The present invention relates to a semiconductor light-emitting device and a method for manufacturing the semiconductor light-emitting device.

2. Description of the Related Art

A semiconductor light-emitting device is typically produced by growing a semiconductor structure layer including an n-type semiconductor layer, an active layer, and a p-type semiconductor layer on a growth substrate and forming an n-electrode and a p-electrode for applying voltage to the n-type semiconductor layer and the p-type semiconductor layer, respectively. For example, semiconductor lasers in which a semiconductor structure layer constitutes a resonator are currently known.

Patent Literature 1 (Japanese Patent No. 5451724) discloses a method for manufacturing a semiconductor laser device, including: a step of forming a cleavage guide groove on a scribe line of a fabrication substrate in which an epitaxial layer is provided on a semipolar plane; and a step of cleaving the fabrication substrate along the scribe line. Patent Literature 2 (Japanese Patent Application Laid-Open No. 2011-211244) discloses a semiconductor laser device including a support substrate having a semipolar principal plane and a laser structure provided on the support substrate. Patent Literature 3 (Japanese Patent Application Laid-Open No. 2008-060478) discloses a semiconductor laser device including a chip obtained by cutting out a substrate and a semiconductor multi-layer structure formed on the substrate.

SUMMARY OF THE INVENTION

Such a semiconductor light-emitting device emits light by the recombination of electrons and holes injected into the device from the electrodes in the active layer. In a semiconductor light-emitting device having a resonator structure, such as a semiconductor laser, end faces of a semiconductor structure layer opposed to each other constitute a resonator. In order to reduce the oscillation threshold of the semiconductor laser, for example, these two end faces opposed to each other need to have smooth surfaces parallel to each other and to be formed perpendicular to the active layer.

As described in the above Patent Literatures, when a light-emitting device is produced with a hexagonal semiconductor material, for example, it is known that a semipolar plane of a growth substrate is used as a crystal growth plane and a semiconductor structure layer is grown on the semipolar plane. The use of the semiconductor structure layer grown on the semipolar plane can reduce the deterioration of the luminous efficiency due to the generation of an internal electric field in a light-emitting layer as compared with a case where a semiconductor structure layer grown, for example, on a c-plane (i.e., (0001) plane), which is a polar plane, is used. Consequently, the luminous efficiency of the light-emitting device can be improved. Thus, the threshold current can be reduced by producing a light-emitting device with a semiconductor structure layer grown on a semipolar plane.

The present invention has been made in view of the aforementioned matters, and it is an object of the present invention to provide a semiconductor light-emitting device including a semiconductor structure layer formed on a semipolar plane and having resonator end faces with high degrees of parallelism and smoothness and achieving a significantly reduced threshold current, and a method for manufacturing such a semiconductor light-emitting device.

According to one aspect of the present invention, there is provided a method for manufacturing a semiconductor light-emitting device, including the steps of: forming, in a semiconductor wafer including a semiconductor structure layer formed on a semipolar plane of a semiconductor substrate, a plurality of linear line electrodes on the semiconductor structure layer so as to be parallel to one another; forming a plurality of guide grooves so as to be each depressed from a surface of the semiconductor structure layer toward the semiconductor substrate between adjacent ones of the plurality of line electrodes and to align and extend along a direction perpendicular to an extending direction of the plurality of line electrodes; forming, in each of the plurality of guide grooves, a scribe groove so as to be depressed from a bottom surface of the guide groove toward the semiconductor substrate and to extend along an extending direction of the guide groove; and dividing the semiconductor wafer along the plurality of guide grooves. The guide groove and the scribe groove are formed to have end shapes in such a manner that inner walls thereof project toward each other in an extending direction of the scribe groove.

According to another aspect of the present invention, there is provided a semiconductor light-emitting device including: a semiconductor substrate having a semipolar plane; a semiconductor structure layer formed on the semipolar plane and including end faces opposed to each other to constitute a resonator; a line electrode linearly extending between the end faces opposed to each other on the semiconductor structure layer; a first depression that is depressed from a surface of the semiconductor structure layer toward the semiconductor substrate in each of the end faces opposed to each other and extends from a portion lateral to the line electrode along each of the end faces opposed to each other; and a second depression that is formed on a bottom surface of the first depression in each of the end faces opposed to each other and extends along each of the end faces opposed to each other. The first and second depressions have end shapes formed in such a manner that inner walls thereof project toward each other in an in-plane direction of the end faces.

DETAILED DESCRIPTION OF THE INVENTION

Embodiments of the present invention will now be described below in detail. Note that the same elements are herein denoted by the same reference numerals.

First Embodiment

Figure 1A:
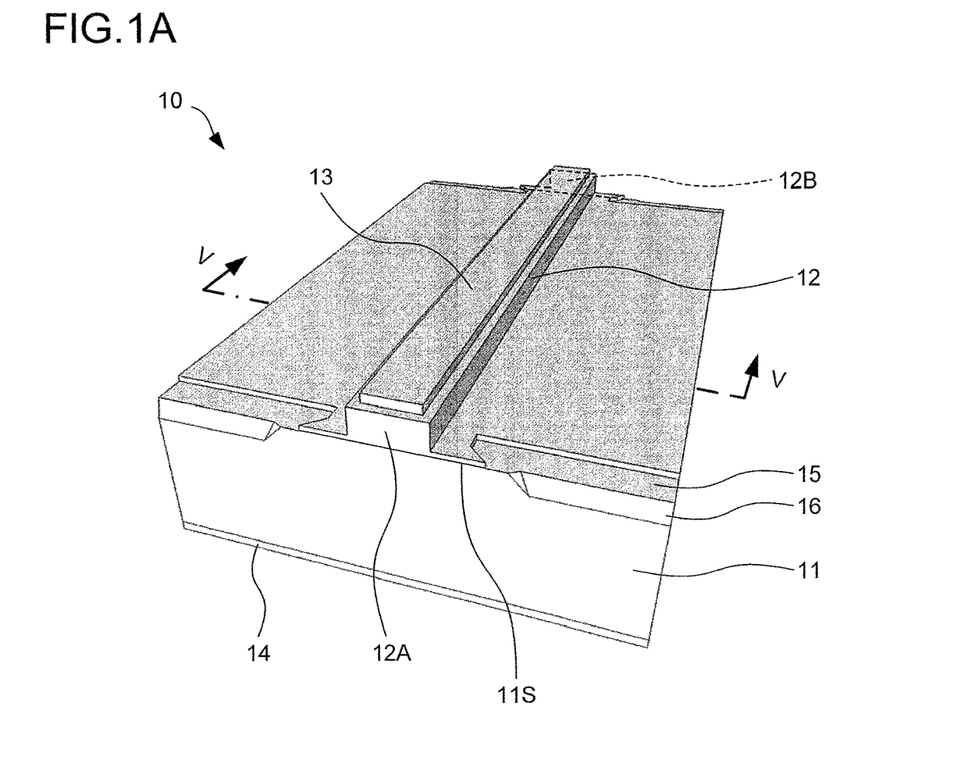
FIG. 1A is a schematic perspective view showing a semiconductor light-emitting device according to a first embodiment of the present invention.

FIG. 1A is a perspective view showing a semiconductor light-emitting device 10 according to a first embodiment of the present invention. The semiconductor light-emitting device 10 has a structure in which a semiconductor structure layer 12 is formed on a semiconductor substrate (hereinafter, may be simply referred to as a substrate) 11. In the present embodiment, the semiconductor light-emitting device 10 is made of a hexagonal semiconductor material. For example, the semiconductor light-emitting device 10 may have a structure in which the semiconductor structure layer 12 having a composition of $Al_xIn_yGa_{1-x-y}N$ ($0 \leq x \leq 1$, $0 \leq y \leq 1$, $0 \leq x+y \leq 1$) is layered on the substrate 11 having a composition of GaN.

The substrate 11 has a semipolar plane 11S as a crystal growth plane. In other words, the substrate 11 in the present embodiment is a semipolar substrate having the semipolar plane 11S as a principal plane. The semiconductor structure layer 12 is formed on the semipolar plane 11S of the substrate 11. As shown in FIG. 1A, the semiconductor structure layer 12 has end faces 12A and 12B opposed to each other. In the semiconductor structure layer 12, the end faces 12A and 12B opposed to each other constitute a resonator (or cavity). In the present embodiment, the end faces 12A and 12B are each formed as a divided surface of the substrate 11 and the semiconductor structure layer 12.

A linearly-shaped line electrode (or first electrode) 13 is formed on the semiconductor structure layer 12 over a region between the end faces 12A and 12B opposed to each other. A back electrode (or second electrode) 14 is formed on a principal plane of the substrate 11 opposite to the crystal growth plane (i.e., semipolar plane 11S). In the present embodiment, a pad electrode (not shown) is formed on the line electrode 13, and the pad electrode and the back electrode 14 are connected to a power source (not shown).

As shown in FIG. 1A, the semiconductor light-emitting device 10 includes first depressions 15 formed from the semiconductor structure layer 12 toward the substrate 11 along the end faces 12A and 12B. The semiconductor light-emitting device 10 also includes second depressions 16 formed from the first depressions 15 toward the substrate 11 along the end faces 12A and 12B. The first and second depressions 15 and 16 are formed on both sides of the line electrode 13 with the line electrode 13 interposed therebetween.

Figure 1B:
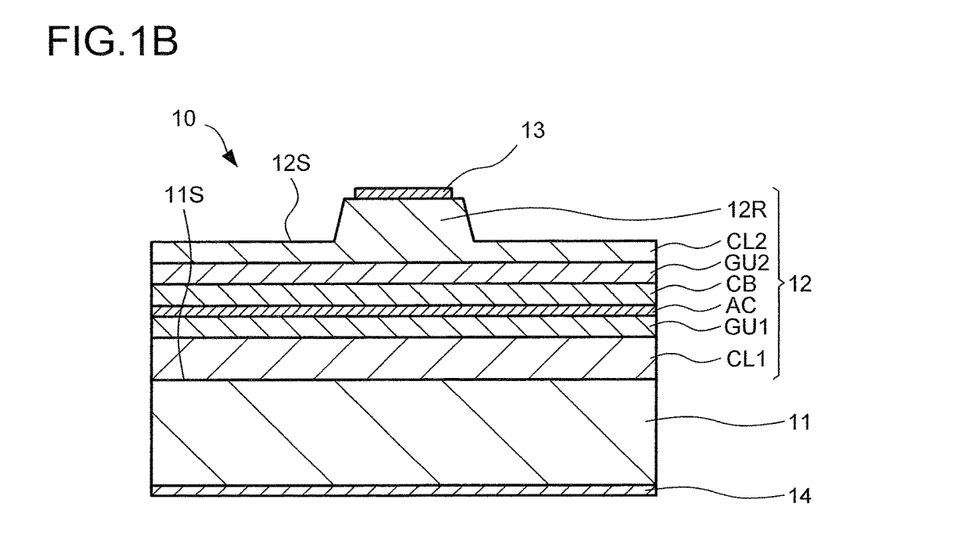
FIG. 1B is a cross-sectional view showing the semiconductor light-emitting device according to the first embodiment.

FIG. 1B is a cross-sectional view of the semiconductor light-emitting device 10. Note that FIG. 1B is the cross-sectional view taken along line V-V of FIG. 1A. As shown in FIG. 1B, the semiconductor structure layer 12 in the present embodiment has a structure in which a first cladding layer CL1, a first optical guide layer GU1, an active layer AC, a carrier blocking layer CB, a second optical guide layer GU2, and a second cladding layer CL2 are sequentially layered on the semipolar plane 11S of the substrate 11.

The semiconductor structure layer 12 includes a ridge portion 12R protruding from a surface 12S of the semiconductor structure layer 12. In the present embodiment, the ridge portion 12R is a portion protruding from the other surface portion of the second cladding layer CL2. The line electrode 13 is formed on the ridge portion 12R. The ridge portion 12R and the line electrode 13 have a function of confining (or concentrating) current flowing through the semiconductor structure layer 12 to a region of the active layer AC directly below the line electrode 13. Current applied to the semiconductor structure layer 12 flows while being confined to the portion of the active layer AC near the line electrode 13 and the ridge portion 12R.

Figure 2A:
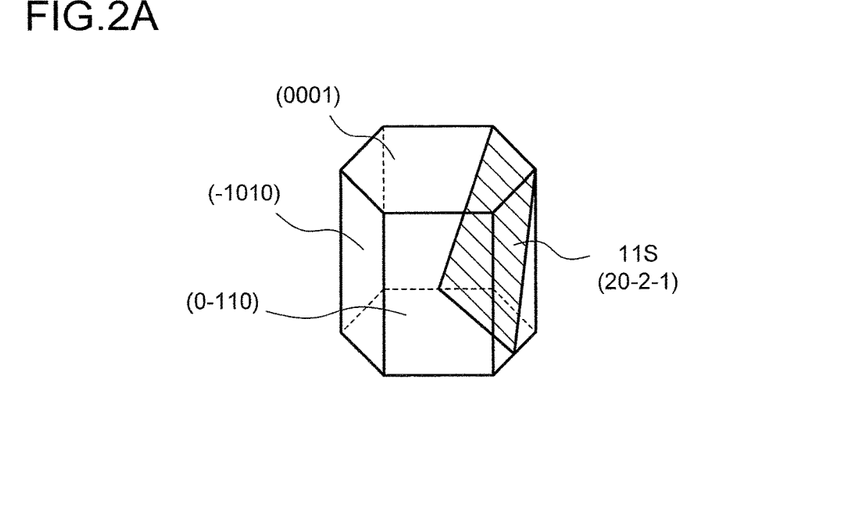
FIG. 2A is a schematic diagram showing a crystal growth plane of a substrate in the semiconductor light-emitting device according to the first embodiment.

FIG. 2A is a diagram schematically showing the semipolar plane 11S, which is a crystal growth plane of the substrate 11. In the present embodiment, the semipolar plane 11S of the substrate 11 is a (20-2-1) plane. FIG. 2A schematically shows a relation of the semipolar plane 11S (or (20-2-1) plane) with respect to a polar plane ((0001) plane, i.e., a c-plane) and non-polar planes (i.e., a (-1010) plane and a (0-110) plane, or m-planes). As shown in FIG. 2A, the semipolar plane 11S in the present embodiment is a crystal plane slanted to the c-plane and the m-plane and a plane having a semipolar property. The semiconductor structure layer 12 is grown on such a semipolar plane 11S.

Figure 2B:
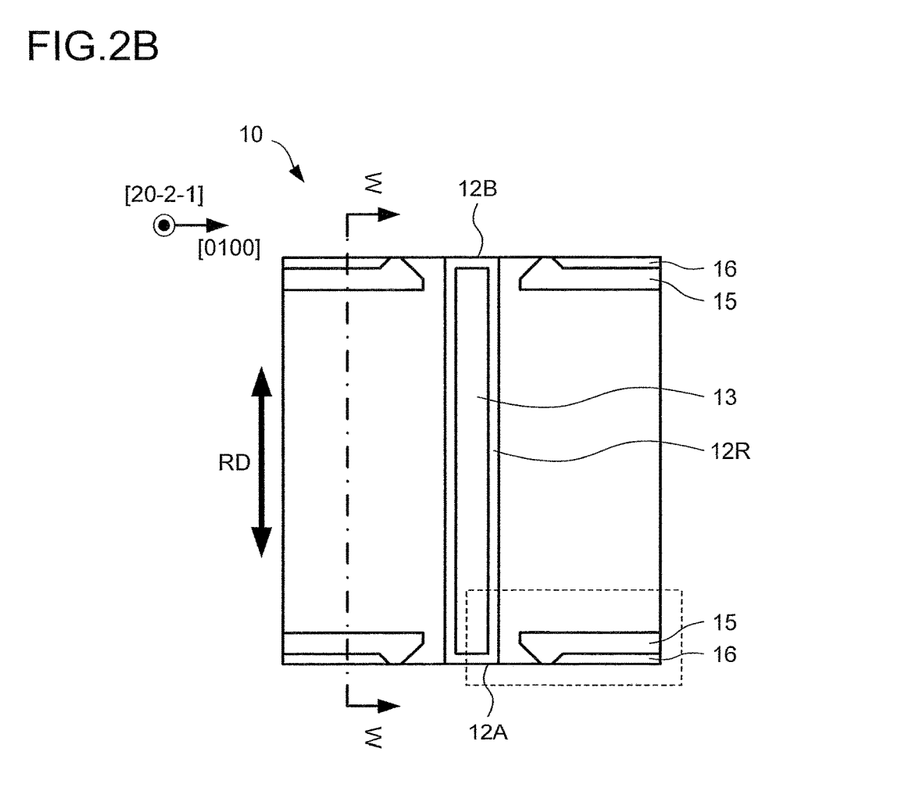
FIG. 2B is a top view showing the semiconductor light-emitting device according to the first embodiment.

FIG. 2B is a top view of the semiconductor light-emitting device 10. Note that FIG. 2B is a plan view of the semiconductor light-emitting device 10 as seen from a direction perpendicular to the semipolar plane 11S. First, the end faces 12A and 12B are formed parallel to each other as shown in FIG. 2B. In the present embodiment, the ridge portion 12R extends from the end face 12A to the end face 12B. The line electrode 13 extends between the end faces 12A and 12B along the ridge portion 12R. The extending direction (i.e., longitudinal direction) of the ridge portion 12R and the line electrode 13 is the direction perpendicular to the end faces 12A and 12B.

When the semipolar plane 11S is the (20-2-1) plane, the ridge portion 12R and the line electrode 13 are preferably formed so that a resonator length direction RD is parallel to a c-axis direction (or [0001] direction) of the semiconductor substrate 11. In other words, the resonator length direction RD is preferably the direction perpendicular to an a-axis direction (or [0100] direction) of the semiconductor substrate 11 as shown in FIG. 2B.

The semiconductor structure layer 12 is configured so that light emitted in the active layer AC resonates between the end faces 12A and 12B opposed to each other. The length of the resonator structure of the semiconductor structure layer 12 corresponds to the distance between the end faces 12A and 12B. The width of the resonator structure corresponds to the width of the ridge portion 12R or the line electrode 13. As shown in FIG. 2B, the resonator length direction RD of the resonator constituted by the semiconductor structure layer 12 is the direction parallel to the extending direction of the ridge portion 12R and the line electrode 13. As shown in FIG. 2B, the first depressions 15 extend from portions lateral to the ridge portion 12R along the end faces 12A and 12B. The second depressions 16 extend along the end faces 12A and 12B in the first depressions 15.

Figure 3A:
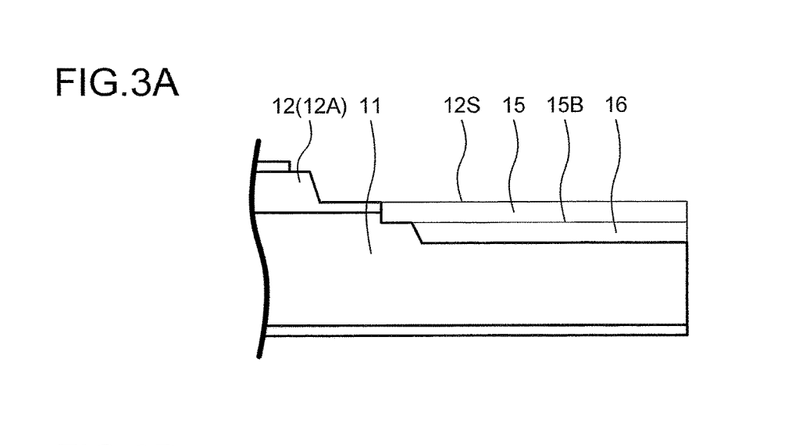
FIGS. 3A and 3B are a side view and a top view partially showing a resonator end face in the semiconductor light-emitting device according to the first embodiment, respectively.

FIG. 3A is a side view showing the end face 12A of the semiconductor light-emitting device 10. Note that FIG. 3A shows only part of the side surface of the semiconductor light-emitting device 10 including the end face 12A. As shown in FIG. 3A, the first depression 15 in the present embodiment is formed from the surface 12S of the semiconductor structure layer 12 toward the substrate 11. The first depression 15 includes a flat bottom surface 15B. The second depression 16 is the depression formed deeper into the substrate 11 from the bottom surface 15B of the first depression 15. The first and second depressions 15 and 16 as a whole can be considered as a depression formed in two steps from the surface 12S of the semiconductor structure layer 12.

Figure 3B:
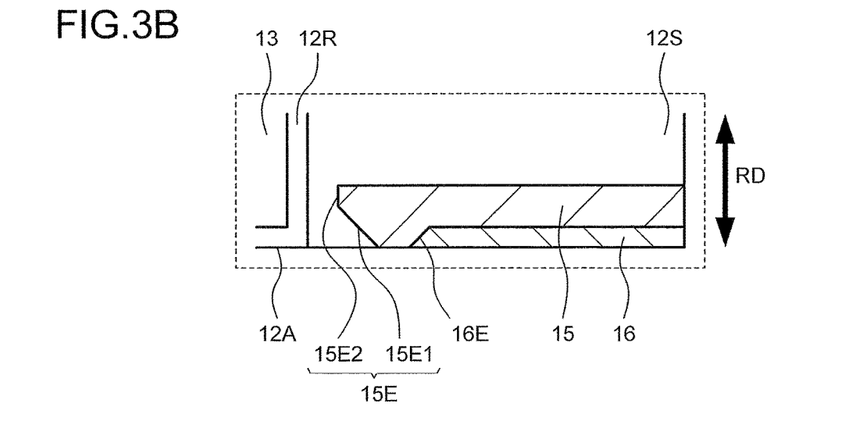

FIG. 3B is a top view showing a portion of the semiconductor light-emitting device 10 near the first and second depressions 15 and 16. FIG. 3B is a partial enlarged top view showing a region surrounded by a broken line in FIG. 2B in an enlarged manner. For the sake of clarity, the first and second depressions 15 and 16 are hatched in FIG. 3B. As shown in FIG. 3B, the first depression 15 includes an end (i.e., first end) 15E at a portion lateral to the line electrode 13. The first depression 15 extends to a side surface of the semiconductor structure layer 12 along the end face 12A. The second depression 16 includes an end (i.e., second end) 16E at a position farther away from the line electrode 13 than the end 15E of the first depression 15. The second depression 16 extends to the side surface of the semiconductor structure layer 12 along the end face 12A.

The end 15E of the first depression 15 includes a pointed end portion (or first pointed end portion) 15E1 formed in such a manner that the inner wall thereof projects toward the end 16E of the second depression 16 as viewed from the above. The end 16E of the second depression 16 is a pointed end portion (or second pointed end portion) formed in such a manner that the inner wall thereof projects toward the pointed end portion 15E1 of the first depression 15 as viewed from the above. In the present embodiment, the end 15E of the first depression 15 includes the pointed end portion 15E1 and a base end portion 15E2.

In other words, the first and second depressions 15 and 16 have end shapes formed in such a manner that the inner walls thereof project toward each other in an in-plane direction of the end face 12A or 12B. In the present embodiment, the pointed end portion 15E1 of the first depression 15 and the pointed end portion 16E of the second depression 16 have V-shapes with their apexes facing each other in the end face 12A as shown in FIG. 3B. Thus, the first and second depressions 15 and 16 are configured so that a distance between the inner walls thereof is reduced in the end faces 12A and 12B.

Figure 3C:
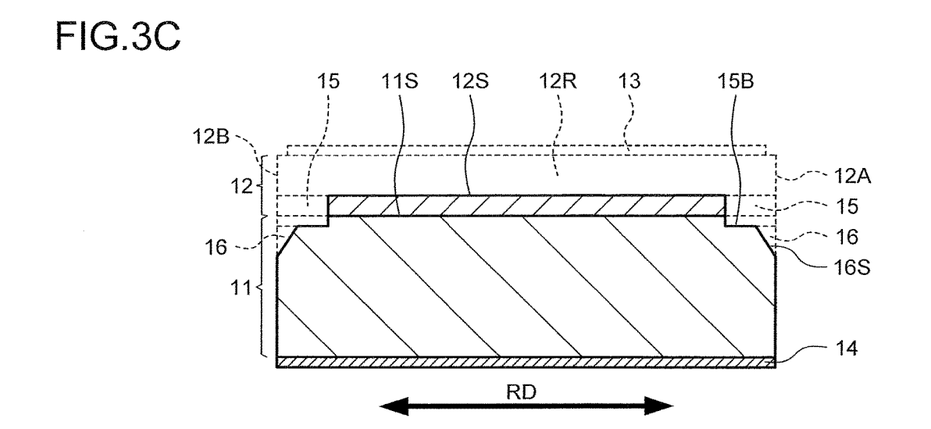
FIG. 3C is a cross-sectional view along a resonator length direction of the semiconductor light-emitting device according to the first embodiment.

FIG. 3C is a cross-sectional view of the semiconductor light-emitting device 10 along the resonator length direction RD. Note that FIG. 3C is the cross-sectional view taken along line W-W of FIG. 2B. As shown in FIGS. 3C and 3A, the first depression 15 extends from the surface 12S of the semiconductor structure layer 12 into the substrate 11. In other words, the first depression 15 has a depth starting from the surface 12S of the semiconductor structure layer 12, passing through the semiconductor structure layer 12, and reaching the inside of the substrate 11. Therefore, the bottom surface 15B of the first depression 15 is a part of the substrate 11. The second depression 16 includes an inner wall surface 16S slanted from the bottom surface 15B of the first depression 15 toward the end face 12A or 12B. In other words, the second depression 16 is formed as a slanted surface formed like a chamfered portion between the bottom surface 15B of the first depression 15 and the end face 12A or 12B. The slanted inner wall surface 16S of the second depression 16 is formed so as to connect between the bottom surface 15B of the first depression 15 and the end face 12A or 12B.

Figure 4:
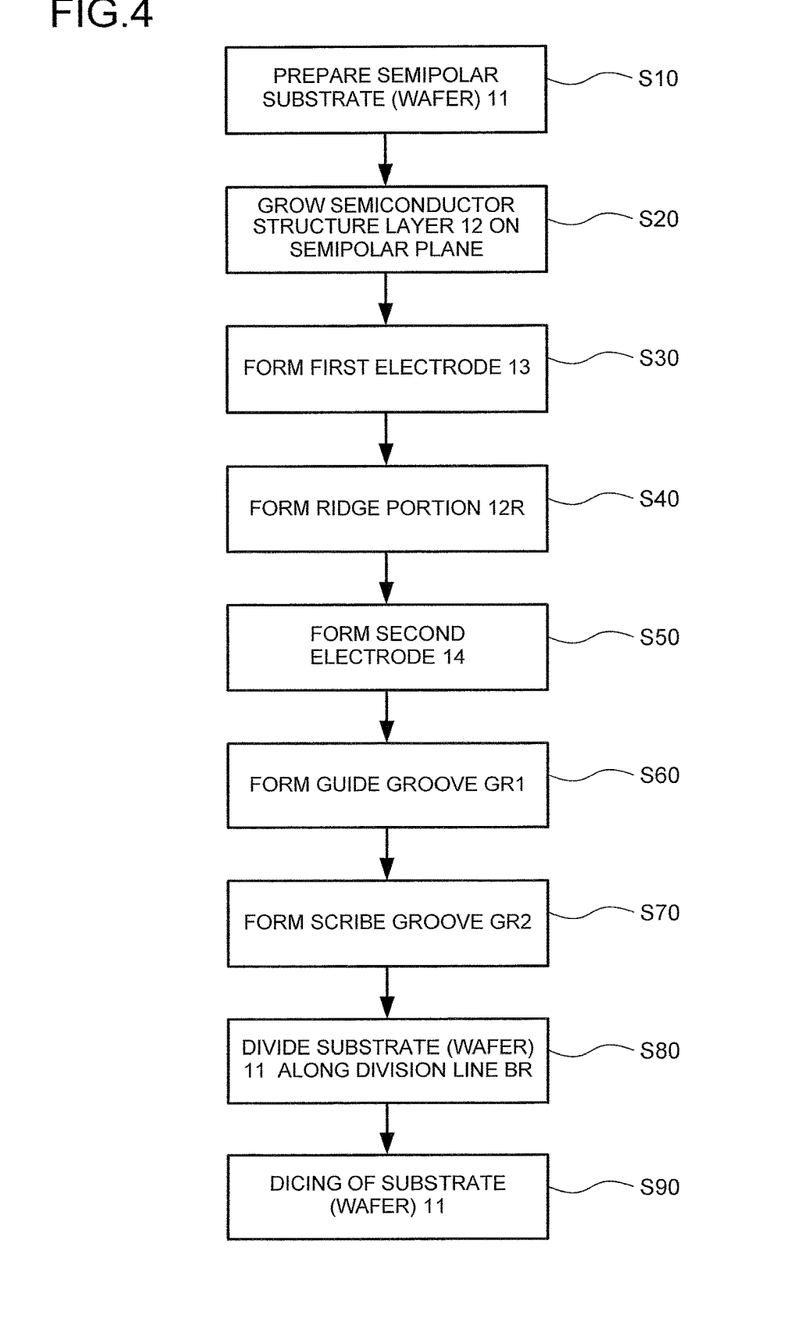
FIG. 4 is a flow chart showing a method for manufacturing the semiconductor light-emitting device according to the first embodiment.

FIG. 4 is a flow chart showing a method for manufacturing the semiconductor light-emitting device 10. FIGS. 5A to 8B are schematic diagrams each showing a wafer WH during the production of the semiconductor light-emitting device 10. The semiconductor light-emitting device 10 can be produced through steps shown in FIG. 4. First, the semiconductor wafer WH including the semiconductor structure layer 12 formed on the semipolar plane 11S of the semiconductor substrate 11 is prepared. More specifically, the semiconductor substrate 11 having the semipolar plane 11S as a principal plane is first prepared (step S10). In the present embodiment, the GaN substrate 11 having the (20-2-1) plane as the semipolar plane 11S at a principal plane and having an n-type conductivity is prepared.

Next, the semiconductor structure layer 12 is grown on the semipolar plane 11S (step S20). In the present embodiment, the first cladding layer CL1 having a composition of $Al_xIn_yGa_{1-x-y}N$ ($0 \le x \le 1$, $0 \le y \le 1$, $0 \le x+y \le 1$), the first optical guide layer GU1, the active layer AC, the carrier blocking layer CB, the second optical guide layer GU2, and the second cladding layer CL2 are sequentially grown as the semiconductor structure layer 12 on the semipolar plane 11S. In the present embodiment, an n-type layer is grown as the first cladding layer CL1, and a p-type layer is grown as the second cladding layer CL2. In this manner, the semiconductor wafer WH including the semiconductor structure layer 12 formed on the semipolar plane 11S of the semiconductor substrate 11 is prepared.

Figure 5A:
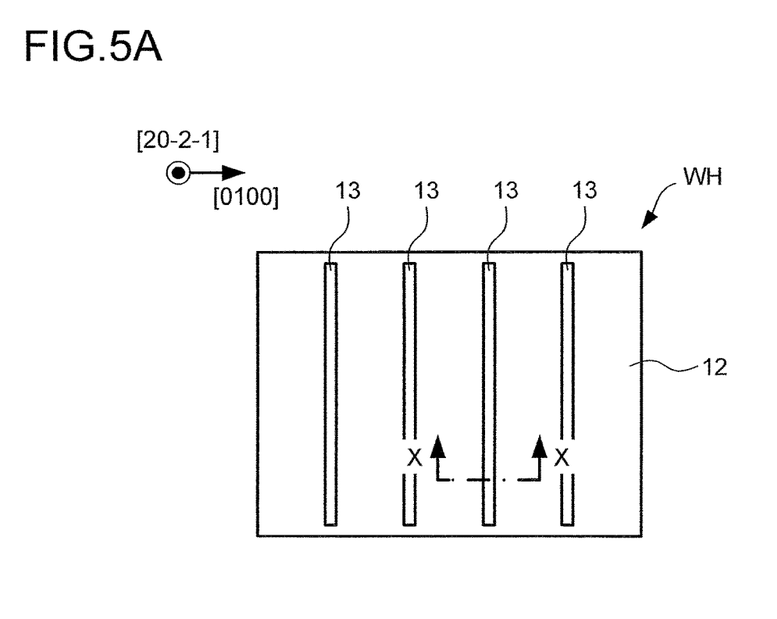
FIG. 5A is a schematic top view showing a wafer during the manufacturing of the semiconductor light-emitting device according to the first embodiment.
Figure 5B:
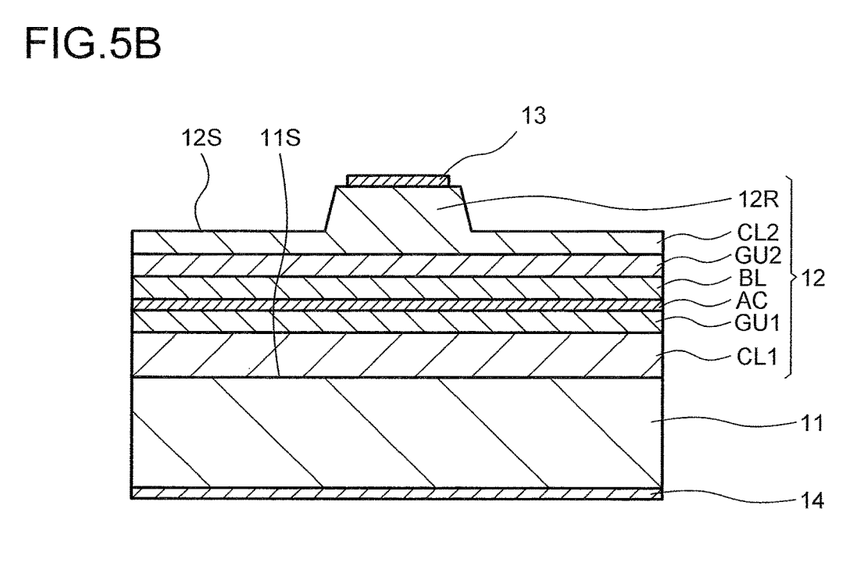
FIG. 5B is a partial cross-sectional view showing the wafer during the manufacturing of the semiconductor light-emitting device according to the first embodiment.

Next, a plurality of linear line electrodes (i.e., first electrodes) 13 are formed on the semiconductor structure layer 12 so as to be parallel to one another (step S30). Subsequently, the ridge portion 12R is formed in the semiconductor structure layer 12 (step S40). The back electrode (second electrode) 14 is formed (step S50). FIG. 5A is a top view showing the semiconductor wafer WH in which the semiconductor structure layer 12 and the line electrodes 13 are formed. FIG. 5B is a cross-sectional view showing the semiconductor wafer WH in which the semiconductor structure layer 12, the line electrode 13, the back electrode 14, and the ridge portion 12R are formed. Note that FIG. 5B is the cross-sectional view taken along line X-X of FIG. 5A.

In the present embodiment, the line electrodes 13 are provided by forming a plurality of metal layers extending in the direction parallel to the c-axis direction and disposed parallel to one another at equal intervals on the second cladding layer CL2 as shown in FIG. 5A. Thereafter, a surface portion of the second cladding layer CL2 where no line electrodes 13 are formed is etched. In this manner, the region of the second cladding layer CL2 where no line electrodes 13 are formed is partially removed as shown in FIG. 5B. Consequently, the regions of the second cladding layer CL2 where the line electrodes 13 are formed protrude more than the other region of the second cladding layer CL2, resulting in the formation of the ridge portions 12R and the surface 12S of the other portion of the semiconductor structure layer 12. The back electrode 14 is provided by forming a metal layer on the principal plane of the substrate 11 where no semiconductor structure layer 12 is formed.

Figure 6A:
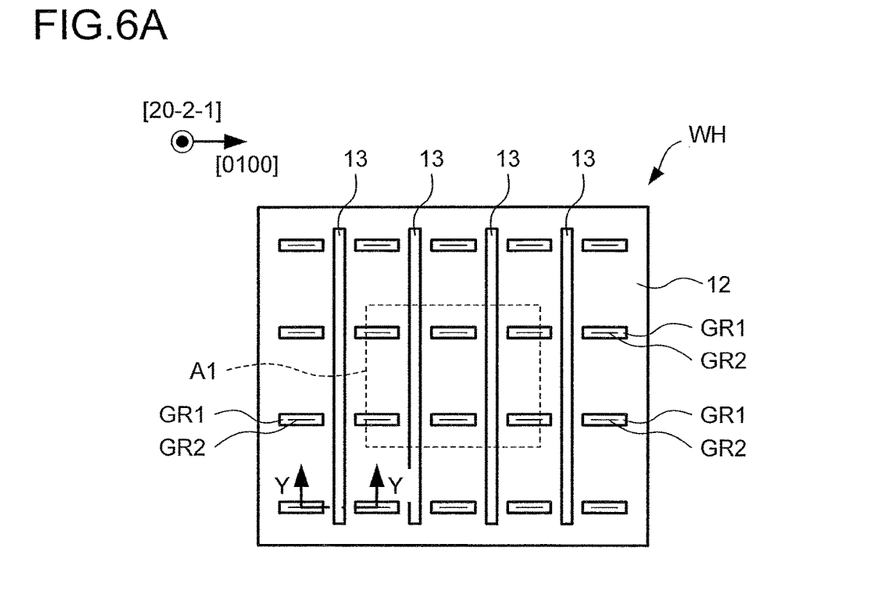
FIG. 6A is a schematic top view showing the wafer during the manufacturing of the semiconductor light-emitting device according to the first embodiment.
Figure 6B:
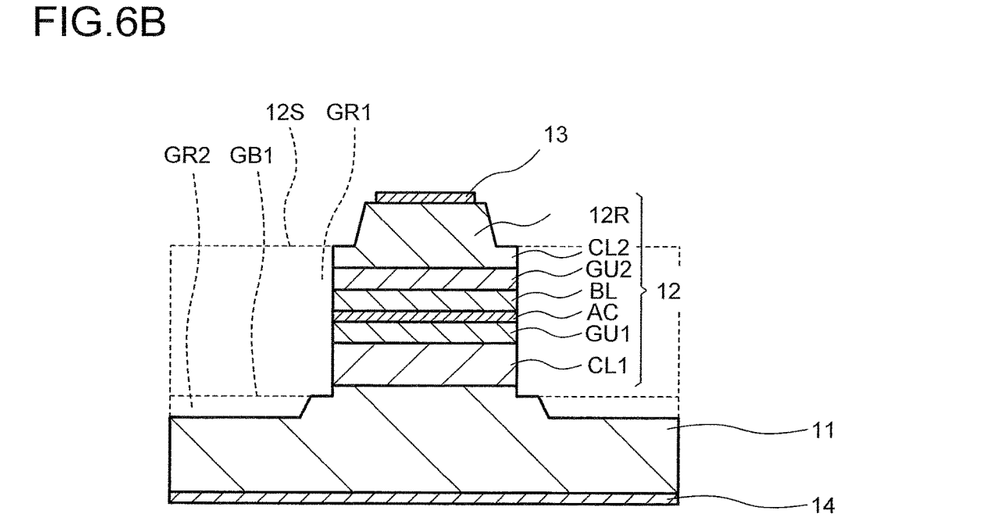
FIG. 6B is a partial cross-sectional view showing the wafer during the manufacturing of the semiconductor light-emitting device according to the first embodiment.

As shown in FIG. 4, guide grooves (i.e., first grooves) GR1 and scribe grooves (i.e., second grooves) GR2 are subsequently formed from the surface 12S of the semiconductor structure layer 12 toward the substrate 11 (steps S60 and S70). FIGS. 6A and 6B are, respectively, a top view and a cross-sectional view each showing the semiconductor wafer WH in which the guide grooves GR1 and the scribe grooves GR2 are formed. Note that FIG. 6B is the cross-sectional view taken along line Y-Y of FIG. 6A.

First, the guide grooves (first grooves) GR1 are each formed between adjacent ones of the line electrodes 13 on the surface 12S of the semiconductor structure layer 12 along the direction (i.e., [0100] direction) perpendicular to the longitudinal direction of the line electrode 13 (step S60). In the present embodiment, the guide grooves GR1 are formed by applying a photoresist to the surface 12S of the semiconductor structure layer 12, patterning the photoresist into a predetermined shape by photolithography, and then subjecting the surface 12S to dry etching.

As shown in FIG. 6A, the guide grooves GR1 are linearly disposed so as to align in the [0100] direction on the surface 12S of the semiconductor structure layer 12. As shown in FIG. 6B, the guide groove GR1 is formed to have a depth from the surface 12S of the semiconductor structure layer 12 to the substrate 11. The guide groove GR1 is formed to have a flat bottom surface GB1.

In other words, the guide grooves GR1 are formed in the step S60 to be depressed from the surface 12S of the semiconductor structure layer 12 toward the substrate 11 between the line electrodes 13 and to align and extend along the direction perpendicular to the extending direction of the line electrode 13. The guide grooves GR1 as a whole are formed discontinuously and linearly with the line electrodes 13 interposed thereamong.

Next, the scribe groove GR2 is formed in the guide groove GR1 along the longitudinal direction (i.e., [0100] direction) of the guide groove GR1 (step S70). In the present embodiment, a plurality of scribe grooves GR2, each depressed from the bottom surface GB1 of the guide groove GR1 toward the semiconductor substrate 11 and extending along the extending direction of the guide groove GR1, are formed. The scribe groove GR2 is formed by performing laser scribing or point scribing to the bottom surface GB1 of the guide groove GR1. In this manner, two-step grooves are formed on the surface 12S of the semiconductor structure layer 12.

Figure 7A:
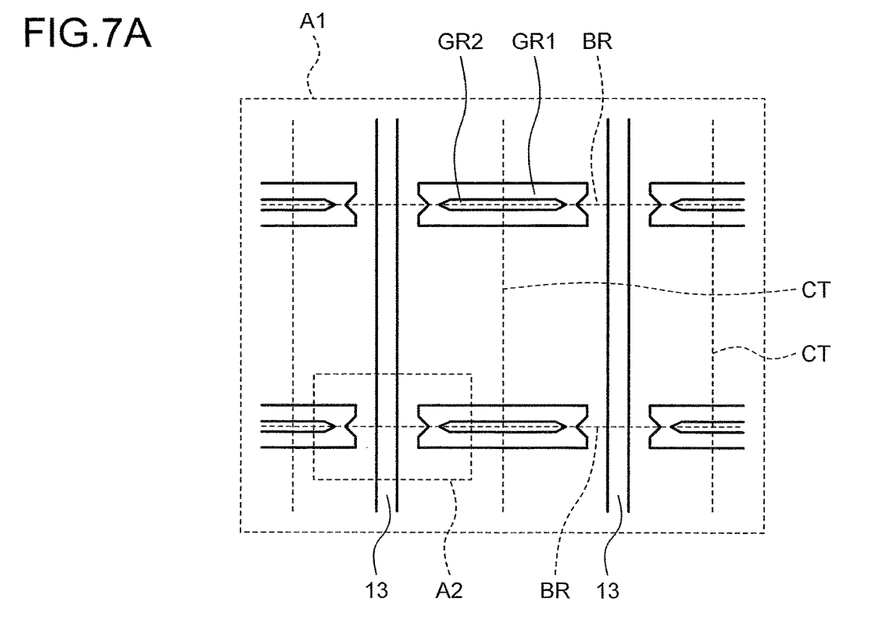
FIG. 7A is an enlarged top view schematically showing the wafer during the manufacturing of the semiconductor light-emitting device according to the first embodiment.
Figure 7B:
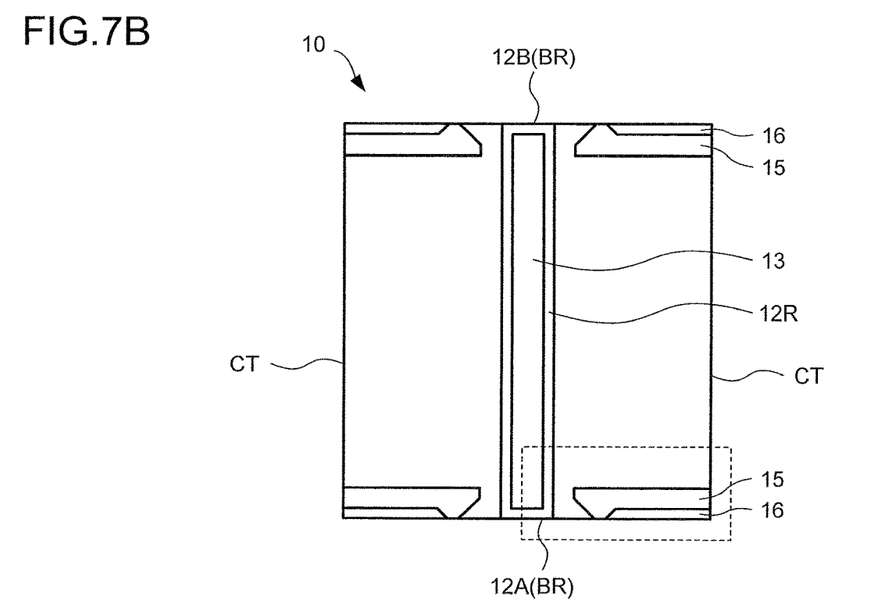
FIG. 7B is a schematic top view showing the semiconductor light-emitting device according to the first embodiment when the manufacturing thereof is completed.

Next, the substrate 11 (wafer WH) is divided along the guide grooves GR1 (step S80) as shown in FIG. 4. Subsequently, the semiconductor wafer WH is cut along the extending direction of the line electrode 13 to singulate the semiconductor wafer WH into individual devices (step S90). These steps will now be described with reference to FIGS. 7A and 7B. FIG. 7A is an enlarged top view showing the semiconductor wafer WH provided with the guide grooves GR1 and the scribe grooves GR2. Note that FIG. 7A is the enlarged view showing a region A1 surrounded by a broken line in FIG. 6A. FIG. 7B is a top view showing the semiconductor wafer WH after the singulation or dicing (i.e., produced semiconductor light-emitting device 10).

In the present embodiment, a straight line connecting the scribe grooves GR2 is defined as a division line BR as shown in FIG. 7A. The substrate 11 and the semiconductor structure layer 12 are divided along the division lines BR. Also, a line parallel to the longitudinal direction of the line electrode 13 is defined as a cutting line CT between adjacent ones of the line electrodes 13. Dicing is performed along the cutting lines CT.

As a result of such division and cutting of the semiconductor wafer WH, the substrate 11 and the semiconductor structure layer 12 singulated (cut) along the division lines BR and the cutting lines CT can be obtained as the semiconductor light-emitting device 10 as shown in FIG. 7B. The thus obtained semiconductor light-emitting device 10 includes two side surfaces of the semiconductor structure layer 12 divided along the division lines BR as the resonator end faces (mirror faces) 12A and 12B. Side surfaces of the semiconductor light-emitting device 10 are cut surfaces of the substrate 11 and the semiconductor structure layer 12 cut along the cutting lines CT.

In the present embodiment, the semiconductor wafer WH is singulated by the dicing along the cutting lines CT. When the semipolar plane 11S of the semiconductor substrate 11 is the (20-2-1) plane, however, the semiconductor wafer WH can be cut (or singulated) by cutting (or cleaving) through the semiconductor wafer WH along the a-axis that is the same direction as the cutting line CT. When the semiconductor wafer WH is divided along the a-axis, an a-plane (i.e., (1-210) plane) is exposed on a side surface of the semipolar plane 11S (which becomes a side surface of the semiconductor structure layer 12).

The guide grooves GR1 and the scribe grooves GR2 remain in the end faces 12A and 12B. As shown in FIG. 7B, the remaining portions of the guide groove GR1 and the scribe groove GR2 serve as the first and second depressions 15 and 16 of the semiconductor light-emitting device 10, respectively.

Figure 8A:
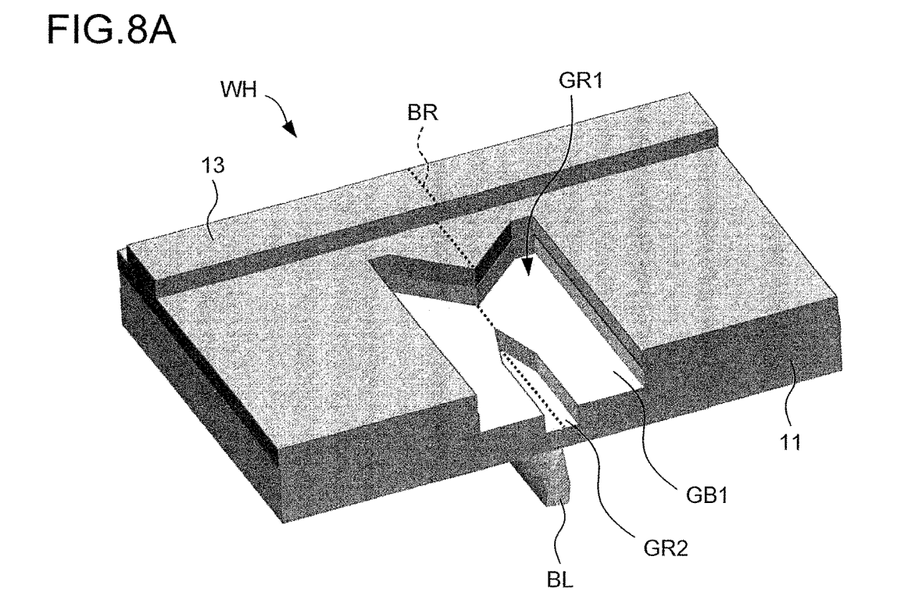
FIG. 8A is a schematic diagram showing a dividing step in the method for manufacturing the semiconductor light-emitting device according to the first embodiment.
Figure 8B:
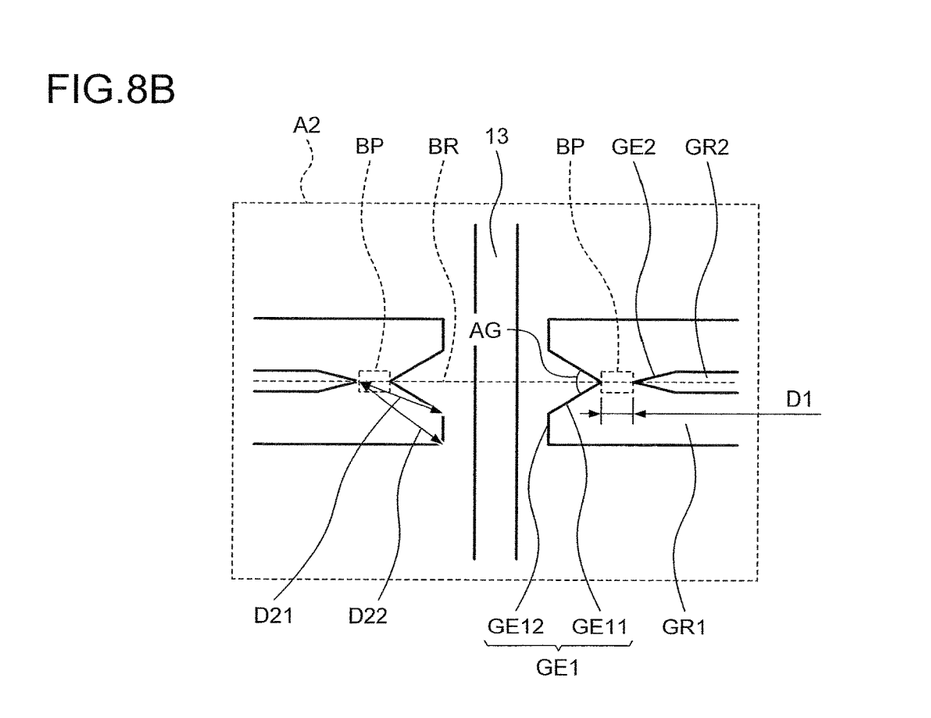
FIG. 8B is an enlarged top view showing guide grooves and scribe grooves during the manufacturing of the semiconductor light-emitting device according to the first embodiment.

The guide groove GR1 and the scribe groove GR2 will now be described with reference to FIGS. 8A and 8B. FIG. 8A is a perspective view schematically showing the wafer WH during the dividing step S80. FIG. 8B is an enlarged top view showing the wafer WH before the dividing step S80. Note that FIG. 8B is the enlarged view showing a region A2 surrounded by a broken line in FIG. 7A.

In the present embodiment, the semiconductor wafer WH is divided in the dividing step S80 first by pressing a blade BL against the rear surface of the substrate 11 along the division line BR as shown in FIG. 8A. In the present embodiment, the blade BL is pressed against the rear surface of the substrate 11 at a slanted angle so that the blade BL is brought into contact with the substrate 11 gradually from one end of the division line BR toward the other end thereof over time.

As shown in FIG. 8B, the guide groove GR1 and the scribe groove GR2 have end shapes formed in such a manner that the inner walls (side walls) thereof project toward each other in the extending direction of the scribe groove GR2. In the present embodiment, the guide groove GR1 includes a pointed end portion (first pointed end portion) GR11 formed in such a manner that the inner wall thereof projects toward an end of the scribe groove GR2. The scribe groove GR2 includes a pointed end portion (second pointed end portion) GE2 formed in such a manner that the inner wall thereof projects toward the pointed end portion GR11 of the guide groove GR1. Due to the formation of such a guide groove GR1 and scribe groove GR2, the portion between the tips of the grooves serves as a division starting point BP, and the semiconductor structure layer 12 is divided along a line segment connecting between apexes of the pointed end portions GE11 adjacent to each other with the line electrode 13 interposed therebetween. In this manner, the resonator end faces 12A and 12B can be obtained.

More specifically, an end GE1 of the guide groove GR1 is provided at a portion lateral to the line electrode 13 as shown in FIG. 8B. The end (pointed end portion) GE2 of the scribe groove GR2 is provided at a position farther away from the line electrode 13 than the end GE1 of the guide groove GR1. As shown in FIG. 8B, the end GE1 of the guide groove GR1 includes the pointed end portion GE11 formed in such a manner that the inner wall thereof projects toward the scribe groove GR2 as viewed from the above, and a base end portion GE12 provided parallel to the extending direction of the line electrode 13. The end GE2 of the scribe groove GR2 has a pointed end shape directed toward the pointed end portion GE11 of the guide groove GR1.

In the present embodiment, the pointed end portion GE11 of the guide groove GR1 and the pointed end portion GE2 of the scribe groove GR2 have V-shapes with their apexes facing each other in the extending direction of the scribe groove GR2. Thus, the guide groove GR1 and the scribe groove GR2 are formed so that a distance between the inner walls thereof is reduced between the apex of the pointed end portion GE11 and the apex of the pointed end portion GE2. Specifically, a distance D1 between the apex of the pointed end portion GE2 and the apex of the pointed end portion GE11 is smaller than distances D21 and D22 between the apex of the pointed end portion GE2 and corners of the base end portion GE12 as shown in FIG. 8B.

When the wafer WH is divided by breaking along the guide grooves GR1, the pressing force of the blade BL is more likely to be concentrated not only on the pointed end portions GE11 and GE2 but also on the corners of the guide groove GR1. The aforementioned reduced distance D1 between the apexes of the pointed end portions GE11 and GE2 (D1<D21 or D22) can prevent the aforementioned corners from being used as starting points of the division (or prevent the corners from serving as division starting points).

The portion between the apexes provided between the grooves becomes a stress concentrated portion having the lowest strength in the semiconductor wafer WH, i.e., the division starting point BP from which the division is started in the dividing step S80. The semiconductor structure layer 12 of the semiconductor wafer WH having started to be divided at the division starting point BP is reliably divided along the line segment connecting the division starting points BP (i.e., the apexes of the pointed end portions GE11). Thus, a high quality divided surface can be obtained with high reproducibility, and such a divided surface functions as a resonator end face having a high reflectivity. This reduces the threshold current, and thus the power-saving semiconductor light-emitting device 10 can be obtained.

In the present embodiment, the semiconductor structure layer 12 is grown on the semipolar plane 11S of the semiconductor substrate 11. Thus, when the resonator end faces 12A and 12B are formed in such a semiconductor structure layer 12, the semiconductor structure layer 12 needs to be divided in the direction perpendicular to the semipolar plane 11S. In the vicinity of such a vertical plane along which the division should be performed, however, a c-plane ((0001) plane) and an m-plane ((10-10) plane), for example, are present. Thus, there was a possibility that the semiconductor wafer WH cracks along an unintended plane or a part of the divided surface becomes chipped when divided. Therefore, there was a possibility that the parallelism, smoothness, and reflectivity in the end faces deteriorate, and thus there was a possibility that the threshold current increases or no laser oscillation occurs.

According to the present embodiment, in contrast, the semiconductor wafer WH can be divided reliably along the desired plane by forming the guide groove GR1 and the scribe groove GR2 having the end shapes directed toward each other. This enables the production of the high quality resonator end faces. Moreover, influence by an internal electric field generated in the semiconductor structure layer 12 can be reduced and thus the luminous efficiency can be improved by growing the semiconductor structure layer 12 on the semipolar plane 11S. Thus, the semiconductor light-emitting device 10 achieving a significantly-reduced threshold current and thus a low power consumption can be provided.

Figure 9:
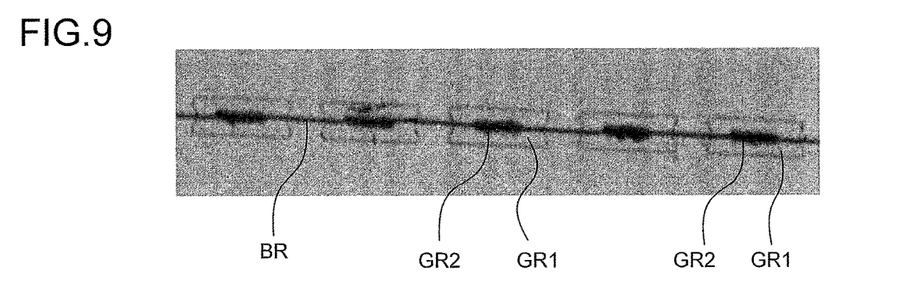
FIG. 9 is an observation image showing an upper surface of the wafer immediately after the dividing step during the manufacturing of the semiconductor light-emitting device according to the first embodiment.

The inventors of the present application actually conducted a test for forming the guide grooves GR1 and the scribe grooves GR2 and dividing the semiconductor wafer WH. FIG. 9 presents an image showing the result of the test. FIG. 9 presents an observation image showing the upper surface of the semiconductor wafer WH after the dividing step S80. It can be seen from FIG. 9 that the semiconductor wafer WH is divided substantially straight along the arrangement direction of the apexes of the pointed end portions GE11. For comparison purposes, the present inventors prepared and divided a semiconductor wafer in which a guide groove and a scribe groove both have pointed end shapes directed toward the line electrode 13. However, such a semiconductor wafer failed to be divided in a linear fashion between the tips of the scribe grooves, resulting in the formation of a slanted and uneven divided surface. Therefore, it can be seen that the effect of the present embodiment is significant.

The semiconductor light-emitting device 10 produced by forming the guide grooves GR1 and the scribe grooves GR2 has high quality divided surfaces, i.e., the resonator end faces 12A and 12B. Thus, such a semiconductor light-emitting device 10 can be a semiconductor laser achieving a low threshold current. In the semiconductor light-emitting device 10, the guide groove GR1 and the scribe groove GR2 remain as the first and second depressions 15 and 16, respectively. Thus, the semiconductor light-emitting device 10 includes the first and second depressions 15 and 16 having the end shapes formed in such a manner that the inner walls thereof facing each other in the end face 12A or 12B. The semiconductor light-emitting device 10 includes the semiconductor structure layer 12 formed on the semipolar plane 11S and having the resonator end faces 12A and 12B with a high reflectivity. Thus, the semiconductor light-emitting device 10 is provided as a semiconductor light-emitting device achieving a significantly-reduced threshold current.

While the (20-2-1) plane is used as the semipolar plane 11S of the substrate 11 in the present embodiment, other planes or equivalent planes thereof having a semipolar property may be used as the semipolar plane 11S of the substrate 11. A (20-21) plane, a (11-22) plane, or a (11-20) plane, for example, may be used as the semipolar plane 11S.

For the purpose of adjusting the reflectivity of the end faces 12A and 12B, for example, a reflecting mirror (not shown) comprising a dielectric multi-layer film, for example, may be provided on the end face 12A or 12B of the semiconductor light-emitting device 10. The reflecting mirror can be formed by depositing a dielectric multi-layer film on the end face 12A or 12B after the dividing step S80. The semiconductor light-emitting device 10 may include a protective film (not shown) on the surface 12S of the semiconductor structure layer 12. Note that the layer structure of the semiconductor structure layer 12 is merely an example. For example, the semiconductor structure layer 12 may include a contact layer (not shown) between the second cladding layer CL2 and the line electrode 13.

In the present embodiment, the first depression 15 and the guide groove GR1 are formed so as to extend from the surface 12S of the semiconductor structure layer 12 into the substrate 11. However, the depth of the first depression 15 and the guide groove GR1 is not limited thereto. It is only required that the first depression 15 and the guide groove GR1 are formed from the surface 12S of the semiconductor structure layer 12 toward the substrate 11.

Preferably, the first depression 15 and the guide groove GR1 are formed with a depth deeper than the active layer AC of the semiconductor structure layer 12. This allows for the division of the semiconductor structure layer 12 without being affected by an internal stress in the active layer AC. In light of producing a high quality divided surface, the first depression 15 and the guide groove GR1 preferably have a depth reaching the substrate 11.

In the present embodiment, the ridge portions 12R are formed in the semiconductor structure layer 12. However, the formation of the ridge portions 12R in the semiconductor structure layer 12 is not an essential step and configuration. For example, no ridge portion 12R may be provided as long as current in the semiconductor structure layer 12 can be confined. For example, the semiconductor structure layer 12 may have only flat surfaces, and the line electrodes 13 may be formed on such a flat surface.

As shown in FIG. 8B, stable division can be achieved by setting an interior angle AG of the pointed end portion GE11 of the guide groove GR1 (i.e., apex angle of the V-shaped portion) in a range of 30° to 150°.

Figure 10A:
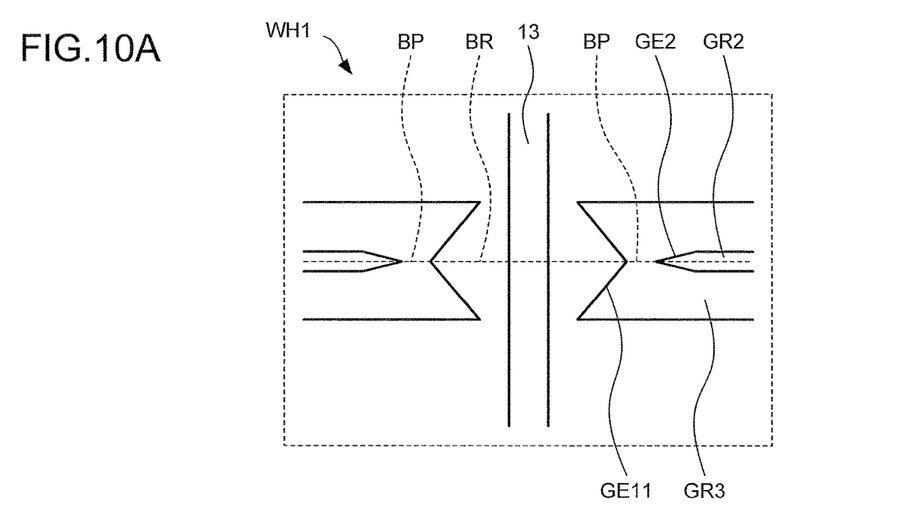
FIG. 10A is a schematic top view showing a wafer during the manufacturing of a semiconductor light-emitting device according to a first modification of the first embodiment.
Figure 10B:
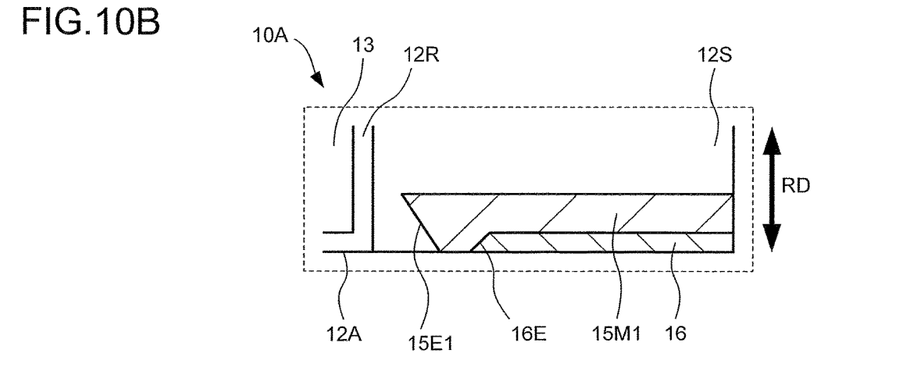
FIG. 10B is a schematic top view showing the semiconductor light-emitting device according to the first modification of the first embodiment.

FIGS. 10A and 10B are schematic top views showing a semiconductor light-emitting device 10A and a semiconductor wafer WH1 during the manufacturing thereof according to a first modification of the first embodiment. FIG. 10A is the top view of the semiconductor wafer WH1 corresponding to FIG. 8B. FIG. 10B is the top view of the semiconductor light-emitting device 10A corresponding to FIG. 3B.

In the present modification, the semiconductor light-emitting device 10A has the same configuration as that of the semiconductor light-emitting device 10 except for the structure of a first depression 15M1. The semiconductor light-emitting device 10A can be manufactured through steps same as those in the method for manufacturing the semiconductor light-emitting device 10 except for the detail of a step of forming a guide groove GR3 (step corresponding to the step S60), for example.

In the present modification, the guide groove GR3 having an end shape including only the pointed end portion GE11 is formed in place of the guide groove GR1 after the step S50 of forming the back electrode 14. In the first embodiment, the guide groove GR1 having the end GE1 including the pointed end portion GE11 and the base end portion GE12 is formed. However, a sufficiently high quality divided surface can be obtained also when the guide groove GR3 including only the pointed end portion GE11 is provided as in the present modification. In the semiconductor light-emitting device 10A, the first depression 15M1, which is a remaining portion of the guide groove GR3, has an end including only the pointed end portion 15E1. The semiconductor light-emitting device 10A can also be a semiconductor light-emitting device achieving a low threshold current.

Figure 11A:
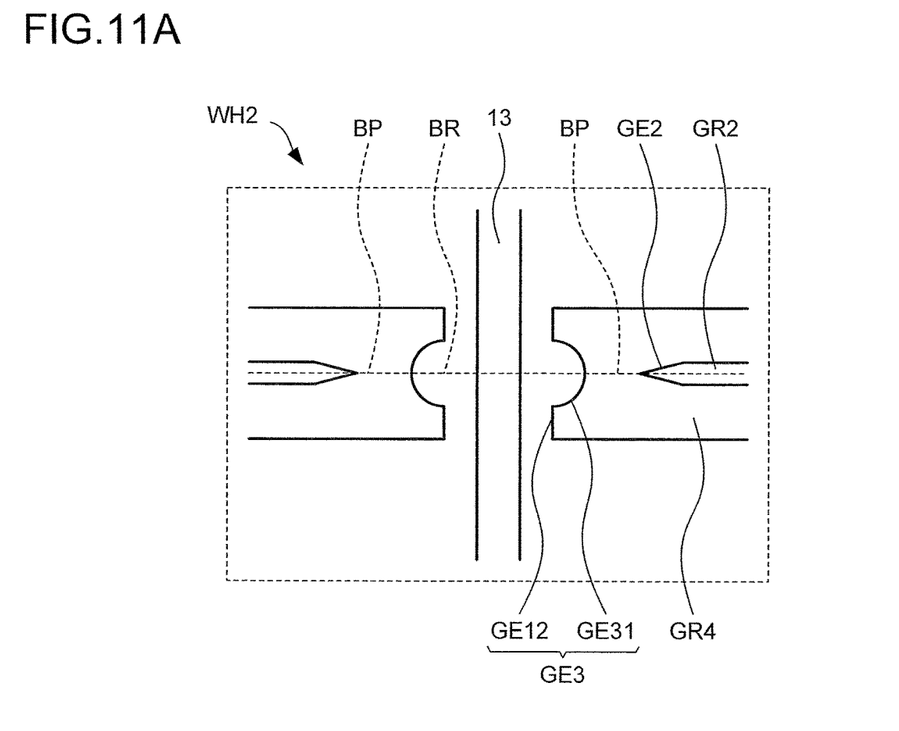
FIG. 11A is a schematic top view showing a wafer during the manufacturing of a semiconductor light-emitting device according to a second modification of the first embodiment.
Figure 11B:
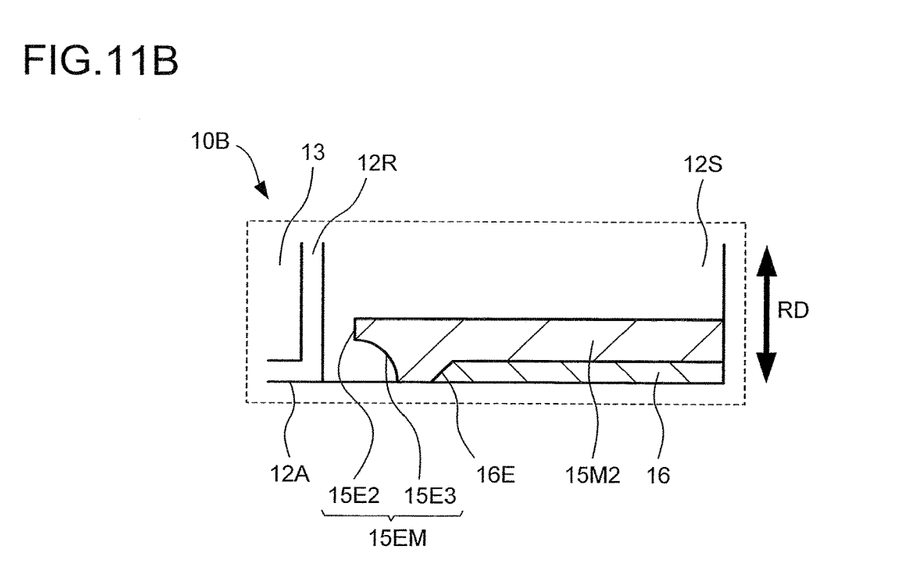
FIG. 11B is a schematic top view showing the semiconductor light-emitting device according to the second modification of the first embodiment.

FIGS. 11A and 11B are schematic top views showing a semiconductor light-emitting device 10B and a semiconductor wafer WH2 during the manufacturing thereof according to a second modification of the first embodiment. FIG. 11A is the top view of the semiconductor wafer WH2 corresponding to FIG. 8B. FIG. 11B is the top view of the semiconductor light-emitting device 10B corresponding to FIG. 3B.

In the present modification, the semiconductor light-emitting device 10B has the same configuration as that of the semiconductor light-emitting device 10 except for the structure of a first depression 15M2. The semiconductor light-emitting device 10B can be manufactured through steps same as those in the method for manufacturing the semiconductor light-emitting device 10 except for the detail of a step of forming a guide groove GR4 (step corresponding to the step S60), for example.

In the present modification, the guide groove GR4 having an end GE3 including a U-shaped or circular-shaped projected end portion GE31 and the base end portion GE12 is formed in place of the guide groove GR1 after the step S50 of forming the back electrode 14. In the first embodiment, the pointed end portion GE11 has a V-shape. In the present modification, however, the guide groove GR4 includes the U-shaped (or circular-shaped) projected end portion GE31 formed in such a manner that the inner wall thereof projects toward the end (pointed end portion) GE2 of the scribe groove GR2. The thus structured guide groove also allows for the formation of a sufficiently high quality divided surface.

In the semiconductor light-emitting device 10B, an end 15EM of the first depression 15M2, which is a remaining portion of the guide groove GR4, includes a U-shaped (or circular-shaped) projected end portion 15E3 formed in such a manner that the inner wall thereof projects toward the end 16E of the second depression 16 and the base end portion 15E2. Resonator end faces having excellent parallelism and smoothness can be obtained also in the semiconductor light-emitting device 10B.

According to the present embodiment and the modifications thereof, the guide grooves GR1 (or the guide grooves GR3 or GR4) and the scribe grooves GR2 are formed before dividing the semiconductor wafer including the semipolar plane as the crystal growth plane. Thereafter, the semiconductor wafer is divided along the scribe grooves GR2 (the guide grooves GR1). This enables the manufacturing of the semiconductor light-emitting device 10 (or the semicontor light-emitting device 10A or 10B) including the resonator end faces 12A and 12B having a high degree of parallelism and a high reflectivity.

The semiconductor light-emitting device 10 (or the semiconductor light-emitting device 10A or 10B) includes the first depression 15 (or the first depression 15M1 or 15M2) and the second depression 16 provided along the end face 12A or 12B. Thus, a semiconductor light-emitting device (e.g., a semiconductor laser) including the semiconductor structure layer 12 provided on the semipolar plane and having the resonator end faces 12A and 12B with a high reflectivity can be provided.

This application is based on a Japanese Patent Application No. 2016-031656 which is hereby incorporated by reference.

What is claimed is:

1. A semiconductor light-emitting device comprising:
   a semiconductor substrate having a semipolar plane;
   a semiconductor structure layer formed on the semipolar plane and including end faces opposed to each other to constitute a resonator;
   a line electrode linearly extending between the end faces opposed to each other on the semiconductor structure layer;
   a first depression that is depressed from a surface of the semiconductor structure layer toward the semiconductor substrate in each of the end faces opposed to each other and extends from a portion lateral to the line electrode along each of the end faces opposed to each other; and
   a second depression that is formed on a bottom surface of the first depression in each of the end faces opposed to each other and extends along each of the end faces opposed to each other,
   wherein:
   the first and second depressions have end shapes formed in such a manner that inner walls thereof project toward each other in an in-plane direction of the end faces,
   the first depression includes a first pointed end portion formed in such a manner that an inner wall thereof projects toward an end of the second depression,
   the second depression includes a second pointed end portion formed in such a manner that an inner wall thereof projects toward the first pointed end portion, and
   the first and second pointed end portions have V-shapes with their apexes facing each other in the end face.

2. The semiconductor light-emitting device according to claim 1, wherein the bottom surface of the first depression is located in the semiconductor substrate.

3. The semiconductor light-emitting device according to claim 1, wherein the semiconductor substrate comprises a hexagonal semiconductor including a (20-2-1) plane as the semipolar plane.

4. A method for manufacturing the semiconductor light-emitting device according to claim 1, the method comprising:
   forming, in a semiconductor wafer including a semiconductor structure layer formed on a semipolar plane of a semiconductor substrate, a plurality of linear line electrodes on the semiconductor structure layer so as to be parallel to one another;
   forming a plurality of guide grooves so as to be each depressed from a surface of the semiconductor structure layer toward the semiconductor substrate between adjacent ones of the plurality of line electrodes and to align and extend along a direction perpendicular to an extending direction of the plurality of line electrodes;
   forming, in each of the plurality of guide grooves, a scribe groove so as to be depressed from a bottom surface of the guide groove toward the semiconductor substrate and to extend along an extending direction of the guide groove;
   dividing the semiconductor wafer along the plurality of guide grooves; and
   cutting the semiconductor wafer along the extending direction of the line electrode to singulate the semiconductor wafer into semiconductor light-emitting devices,
   wherein:
   each of the guide grooves and each of the scribe grooves are formed to have end shapes in such a manner that inner walls of each guide groove and the scribe groove formed therein project toward each other in an extending direction of the scribe groove,
   each of the guide grooves includes a first pointed end portion formed in such a manner that an inner wall thereof projects toward an end of the scribe groove formed in the guide groove, and the scribe groove includes a second pointed end portion formed in such a manner that an inner wall thereof projects toward the first pointed end portion,
   the first and second pointed end portions have V-shapes with their apexes facing each other in the extending direction of the scribe groove.

5. The method according to claim 4, wherein the semiconductor substrate comprises a hexagonal semiconductor including a (20-2-1) plane as the semipolar plane.

* * * * *